(12) United States Patent
Varnica et al.

(10) Patent No.: US 8,924,747 B1
(45) Date of Patent: *Dec. 30, 2014

(54) POWER MANAGEMENT OF ITERATIVE DATA PROCESSING SYSTEMS

(71) Applicant: Marvell International Ltd., Hamilton (BM)

(72) Inventors: Nedeljko Varnica, Sunnyvale, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/021,460

(22) Filed: Sep. 9, 2013

Related U.S. Application Data

(63) Continuation of application No. 12/917,097, filed on Nov. 1, 2010, now Pat. No. 8,533,496.

(60) Provisional application No. 61/259,924, filed on Nov. 10, 2009.

(51) Int. Cl.
*G06F 1/26* (2006.01)
*G06F 1/32* (2006.01)
*G06F 11/30* (2006.01)

(52) U.S. Cl.
CPC ..................................... *G06F 1/26* (2013.01)
USPC ........... 713/300; 713/320; 713/323; 713/324; 713/340

(58) Field of Classification Search
USPC .......................... 713/300, 320, 323, 324, 340
See application file for complete search history.

(56) References Cited

U.S. PATENT DOCUMENTS

| | | | |
|---|---|---|---|
| 8,533,496 | B1 | 9/2013 | Varnica et al. |
| 2002/0080874 | A1 | 6/2002 | Wilson |
| 2004/0158878 | A1 | 8/2004 | Ratnakar et al. |
| 2004/0205322 | A1 | 10/2004 | Shelor |
| 2007/0283227 | A1 | 12/2007 | Sharon et al. |
| 2008/0126686 | A1 | 5/2008 | Sokolov et al. |
| 2009/0256622 | A1 | 10/2009 | Roberts |
| 2009/0313484 | A1 | 12/2009 | Millet et al. |
| 2009/0322572 | A1 | 12/2009 | Mutchnik |
| 2011/0246849 | A1 | 10/2011 | Rault et al. |
| 2011/0289382 | A1 | 11/2011 | Shih et al. |

*Primary Examiner* — Vincent Tran

(57) ABSTRACT

An integrated circuit including a decoding module, a moving average module, and an iteration control module. The decoding module is configured to decode a plurality of information units by performing a number of decoding iterations on each of the plurality of information units. The moving average module is configured to generate a moving average of decoding iterations performed when decoding a selected number of information units of the plurality of information units. The iteration control module is configured to adjust the number of decoding iterations based on (i) the moving average of decoding iterations performed in decoding the selected number of information units of the plurality of information units and (ii) an amount of power consumed by the integrated circuit.

20 Claims, 10 Drawing Sheets

POWER MANAGEMENT OF ITERATIVE DATA PROCESSING SYSTEMS

CROSS-REFERENCE TO RELATED APPLICATIONS

This is a continuation of U.S. patent application Ser. No. 12/917,097, filed on Nov. 1, 2010, which claims the benefit of U.S. Provisional Application No. 61/259,924, filed on Nov. 10, 2009. The entire disclosures of the above applications are incorporated herein by reference.

FIELD

The present disclosure relates generally to data processing systems and more particularly to power management of iterative data processing systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Storage devices such as hard disk drives, optical disc drives, and memory integrated circuits typically store encoded data. The encoded data is read back and decoded. Occasionally, a sector may be corrupted, or a block of memory cells (memory block) may malfunction. Consequently, errors may occur when the data is read back and decoded.

Read channels of the storage devices often perform iterative processing to detect and correct the errors. For example, to correct the errors, the data read back may be decoded one or more times using decoders that perform iterative decoding. Additionally or alternatively, data may be read multiple times and/or decoded using one or more algorithms to correct the errors.

Communication devices such as network devices typically receive encoded data via a communication medium. The received encoded data is decoded. Occasionally, errors may occur when the data is received and decoded. Receive circuits (channels) of the communication devices often perform iterative processing to detect and correct the errors. For example, to correct the errors, the received data may be decoded one or more times using decoders that perform iterative decoding. Additionally or alternatively, data may be received more than once (e.g., via a retransmission) and/or decoded using one or more algorithms to correct the errors.

SUMMARY

An integrated circuit (IC) includes a decoding module configured to decode information units by performing T or less decoding iterations on each of the information units, where a maximum value of T is R, and where T is an integer greater than or equal to 1, and R is an integer greater than or equal to T. An iteration control module is configured to adjust a value of T based on a condition of the IC.

In other features, the condition of the IC includes at least one of a temperature of the IC and an amount of power consumed by the IC, and the iteration control module is configured to adjust the value of T when at least one of (i) the temperature of the IC is greater than or equal to a predetermined temperature and (ii) the amount of power consumed by the IC is greater than or equal to a predetermined level.

In other features, the IC further includes a moving average module configured to generate a moving average of the decoding iterations performed in decoding W of the information units, where W is an integer greater than 1. The iteration control module is configured to adjust the value of T when the moving average is greater than or equal to a predetermined threshold.

In other features, the decoding module is configured to decode one of the information units subsequent to the W information units by performing a number of decoding iterations that is less than or equal to the adjusted value of T.

In other features, when the iterative control module is configured to decode E information units in parallel, where E is an integer greater than 1, the iteration control module is configured to adjust the value of T used to decode an $E^{th}$ information unit following a last of the W information units, and the adjusted value of T is equal to a number of decoding iterations performed to decode a first of the W information units.

In still other features, an integrated circuit (IC) includes a first decoding module configured to decode information units by performing T or less decoding iterations on each of the information units, where a maximum value of T is R, and where T is an integer greater than or equal to 1, and R is an integer greater than or equal to T. A second decoding module is configured to decode the information units when the first decoding module fails to decode one of the information units. The second decoding module consumes less power than the first decoding module. An iteration control module is configured to (i) deactivate the first decoding module and activate the second decoding module, or (ii) adjust a value of T to decode the information units based on a condition of the IC.

In other features, when at least one of (i) a temperature of the IC is greater than or equal to a predetermined temperature and (ii) an amount of power consumed by the IC is greater than or equal to a predetermined level, the iteration control module is configured to activate the second decoder module regardless of whether the first decoding module fails to decode one of the information units.

In other features, the iteration control module is configured to (i) deactivate the first decoding module and activate the second decoding module, or (ii) adjust the value of T to decode the information units until at least one of the temperature of the IC and an amount of power consumed by the IC decreases by a predetermined amount.

In still other features, the systems and methods described herein are implemented by a computer program executed by one or more processors. The computer program can reside on a tangible computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
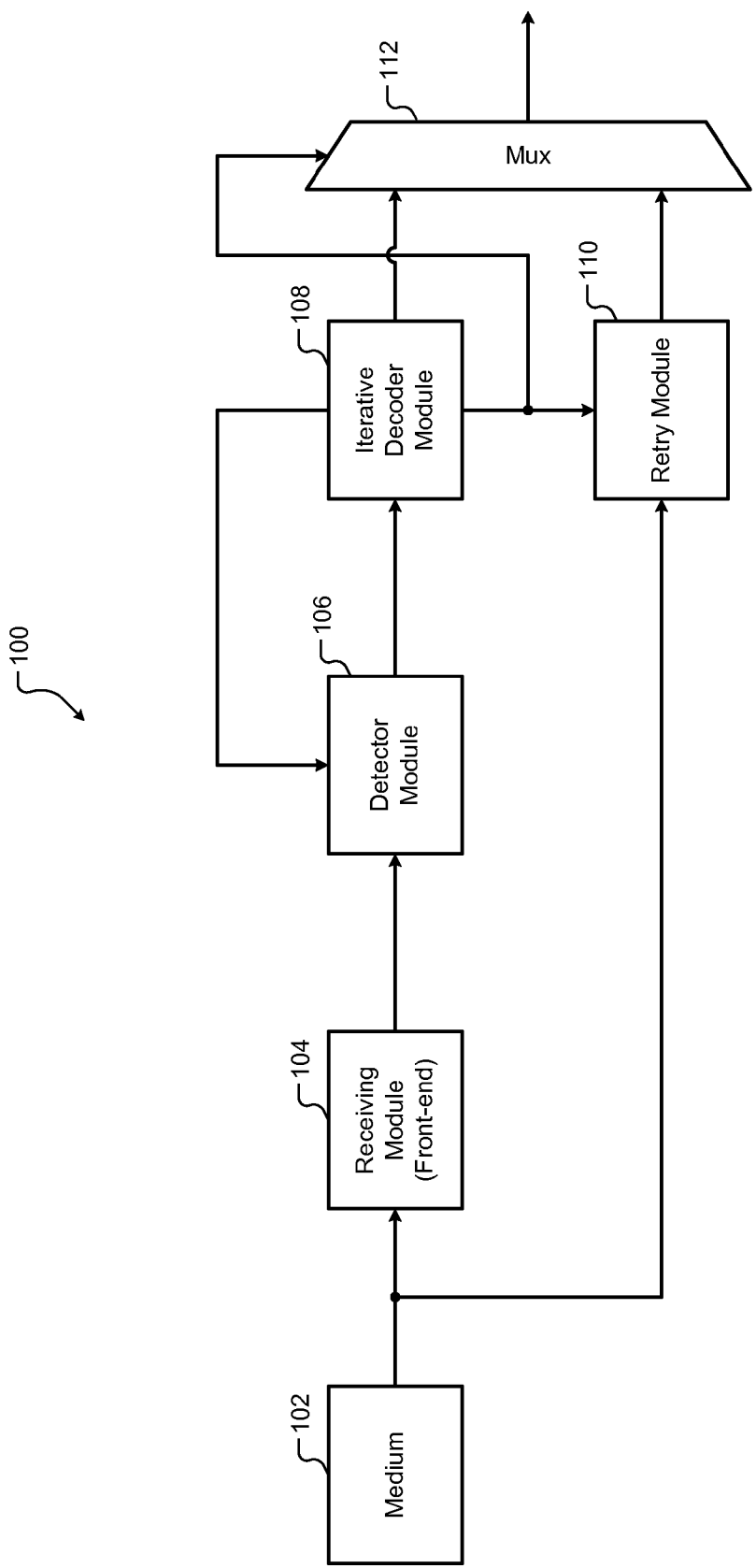
FIG. 1 is a functional block diagram of a system for processing data in storage devices and communication devices.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a processor (shared, dedicated, or group) and/or memory (shared, dedicated, or group) that execute one or more software or firmware programs; a combinational logic circuit; and/or other suitable components that provide the described functionality.

Referring now to FIG. 1, a system 100 for processing data in storage devices and communication devices is shown. The system 100 comprises a medium 102, a receiving module (front-end) 104, a detector module 106, an iterative decoder module 108, a retry module 110, and a multiplexer 112.

In a storage device, the medium 102 may include a hard disk assembly, an optical disc, and/or a memory array of a memory integrated circuit (IC). In a communication device, the medium 102 may include a communication medium such as a wireline or wireless medium.

The receiving module 104 receives data from the medium 102 and generates samples. For example, in storage devices, the receiving module 104 may comprise a read channel that reads data from the medium 102. Additionally, the receiving module 104 may include an analog-to-digital converter (ADC), a filter, etc. In communication devices, the receiving module 104 receives data from the medium 102 and may include a demodulator, an ADC, a filter, etc. In general, the receiving module 104 receives an information unit (e.g., a sector, a memory block, a packet, etc.) from the medium 102 and generates samples.

The detector module 106 detects errors in the samples and outputs error indicia such as probabilities, log-likelihood ratios, etc. The iterative decoder module 108 corrects the errors in the samples using the error indicia and outputs decoded data.

The iterative decoder module 108 uses an iterative decoder (e.g., a low-density parity-check code (LDPC) decoder, Turbo Code decoder, etc.) to perform iterative decoding. The iterative decoder module 108 performs N decoding iterations until a stopping criterion is satisfied, where N is an integer greater than or equal to 1. For example, the iterative decoder module performs up to N decoding iterations until a valid codeword is detected in one of the N decoding iterations.

Most errors can be corrected by performing a single channel iteration, which includes detecting the errors once (e.g., using the detector module 106) and correcting the errors by performing N decoding iterations (e.g., using the iterative decoder module 108). Further, when a signal-to-noise ratio (SNR) is high, most errors can be corrected by detecting the errors once and correcting the errors by performing a single decoding iteration (i.e., N=1). When the iterative decoder module 108 can correct all errors after the detector module 106 is used only once, the detector module 106 need not be used more than once.

Occasionally, more than one channel iteration may be necessary to correct the errors. For example, at the end of a first channel iteration, the iterative decoder module 108 may provide feedback to the detector module 106 after performing N decoding iterations. Based on the feedback, the detector module 106 may begin a second channel iteration.

In the second channel iteration, the detector module 106 may perform error detection again. Subsequently, the iterative decoder module 108 performs N decoding iterations again to complete the second channel iteration, and so on.

The maximum number of channel iterations (e.g., R, where R is an integer greater than or equal to 1) and/or decoding iterations (N) are predetermined based on a specified throughput rate. For example, for a specified throughput rate, R may be 3, and N may be 5.

The system 100 normally operates in an on-the-fly mode, where the error-detection and error-correction operations described above are performed on-the-fly, and decoded data is output at the specified throughput rate. In on-the-fly mode, an information unit is read/received once from the medium 102 and processed using up to a maximum of R channel iterations.

The channel iterations (particularly the decoding iterations), however, are computationally intensive. Accordingly, when the error rate is high, consistently performing a high number of channel iterations (R) and/or decoding iterations (N) can consume a lot of power and can generate a lot of heat.

Occasionally, the system 100 may operate in a retry mode. The system 100 typically switches to the retry mode when an information unit read/received is corrupt, data in the information unit cannot be decoded in R iterations, and/or the number of errors detected in the data is high.

For example, when the data in the information unit cannot be decoded in R iterations, the iterative decoder module 108 may output a control signal indicating a decoding failure. The control signal activates the retry module 110 and deactivates the detector module 106 and the iterative decoder module 108. When activated, the retry module 110 attempts to decode the samples. After the retry module 110 completes decoding, on-the-fly mode is resumed.

In the retry mode, the retry module 110 may execute several retry algorithms. Some of the retry algorithms can utilize the detector module 106 and/or the iterative decoder module 108 as engines. Accordingly, in some implementations, the retry module 110 may optionally include the detector module 106 and/or the iterative decoder module 108.

The retry module 110 processes the samples differently than the processing performed by the detector module 106 and the iterative decoder module 108 in on-the-fly mode. For example, the retry module 110 uses algorithms that are slower than the algorithms used by the detector module 106 and/or the iterative decoder module 108. Occasionally, in the retry mode, an information unit may be read/received again from the medium 102, and detection/decoding can be attempted again using the detector module 106 and the iterative decoder module 108. When the detection/decoding are attempted again, the detector module 106 and the iterative decoder module 108 may require less power and/or take more time. For example, the detector module 106 and the iterative decoder module 108 may consume less power since the detector module 106 and the iterative decoder module 108 may process only one codeword (information unit) at a time during the retry mode instead of processing E information units in parallel (e.g., E=2) during the on-the-fly mode as explained below.

Stated generally, modules that are a part of the retry module 110 perform decoding that is computationally less intensive than the decoding performed by the detector module 106 and the iterative decoder module 108 on-the-fly. Consequently, the retry module 110 consumes less power and generates less heat than the detector module 106 and the iterative decoder module 108. The retry module 110, however, outputs decoded data at less than the specified throughput rate.

The multiplexer 112 multiplexes the decoded data output by the iterative decoder module 108 and the retry module 110. The multiplexer 112 is controlled by the control signal generated by the iterative decoder module 108. Accordingly, the multiplexer 112 outputs the decoded data generated by the iterative decoder module 108 in on-the-fly mode and outputs the decoded data generated by the retry module 110 in retry mode.

The present disclosure relates to reducing the power consumed and heat generated by an IC that performs iterative processing. Two approaches for reducing the power consumed and the heat generated are disclosed. Each approach is used when some monitoring logic or device indicates high power consumption or overheating. For example, each approach is used when some monitoring logic or device indicates that the temperature of the IC or the power consumed by the IC exceeds a predetermined threshold. Stated generally, each approach can be used for two different purposes: preventing overheating and controlling average power.

In a first approach, on-the-fly mode is deactivated and the retry mode is forcibly activated even if a retry is unnecessary. That is, the retry mode is forcibly activated even if the iterative decoder module 108 does not fail to decode data. The retry mode is deactivated and on-the-fly mode is reactivated when the power consumed by the IC decreases to a predetermined level or by a predetermined amount, or when the temperature of the IC decreases to a predetermined temperature or by a predetermined amount.

In a second approach, instead of switching from on-the-fly mode to the retry mode, use of on-the-fly mode is continued. The number of channel iterations (R), decoding iterations (N), or a combined number of R and N to be used in processing subsequent samples is reduced as explained below. For example, R can be reduced while keeping N unchanged, N can be reduced while keeping R unchanged, or both R and N can be reduced.

These approaches reduce average power and peak power consumed by the IC. Accordingly, these approaches prevent the IC from overheating. The second approach may reduce the power consumption less than the first approach, but it may degrade throughput less than the first approach.

In the second approach, a decoding failure may occur when the number of iterations is reduced, and the decoding failure may trigger the retry mode. On-the-fly mode, however, resumes after the decoding is completed in the retry mode.

Figure 10:
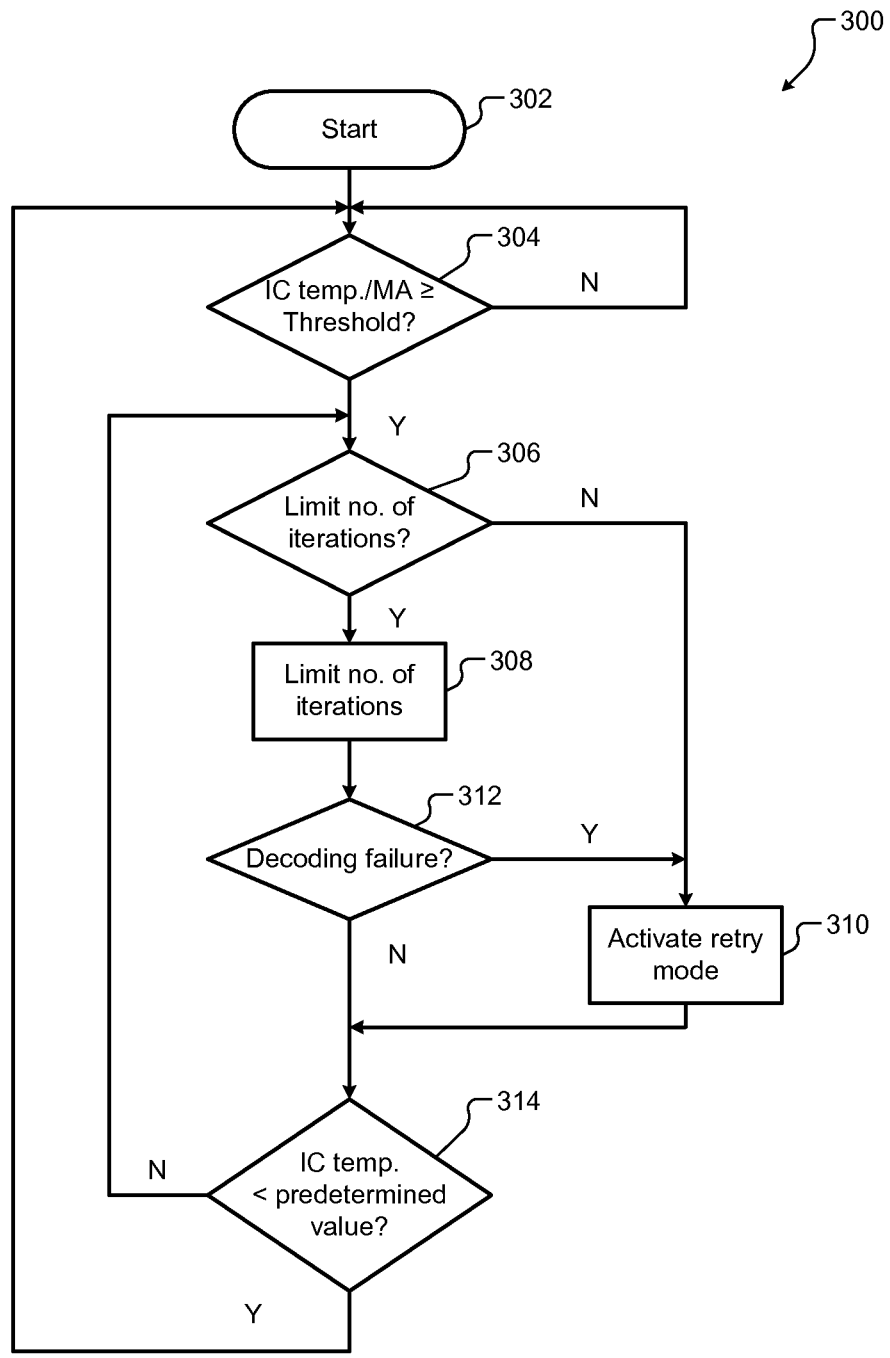
FIG. 10 is a flowchart of a method for controlling power consumed by an IC and preventing the IC from overheating.
Figure 11:
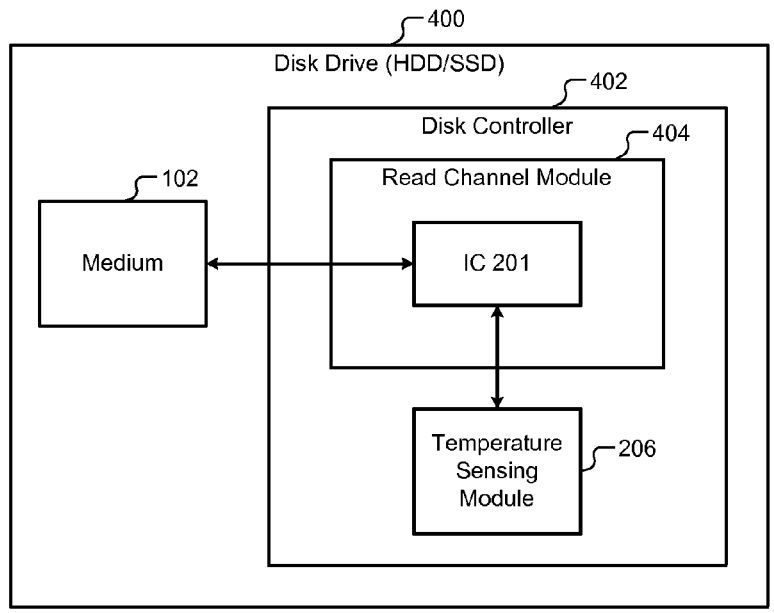
FIG. 11 is a functional block diagram of a disk drive that uses the system/method shown in FIGS. 9-10.

The disclosure is organized as follows. First, referring to FIGS. 2-8, the two approaches are described in detail. Subsequently, referring to FIGS. 9 and 10, a system and method for controlling the power consumed and heat generated by an IC using the two approaches are described. In FIGS. 10 and 11, a disk drive and a communication device that use the system and the method are shown, respectively.

Figure 2:
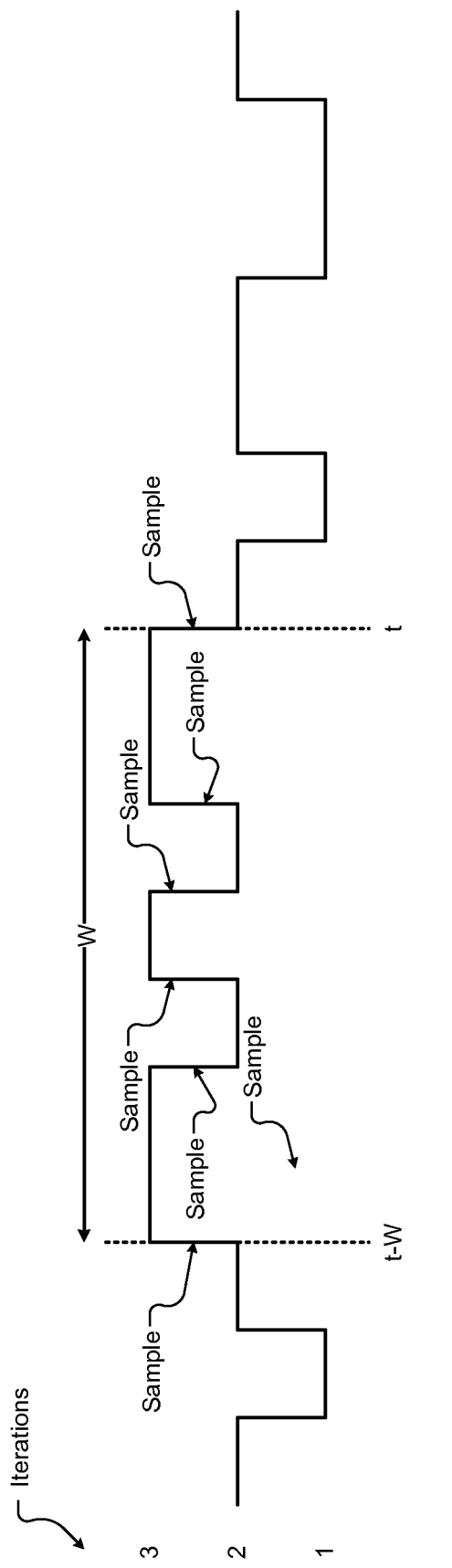
FIG. 2 depicts an example of decoding iterations performed during decoding.

Referring now to FIG. 2, the number of iterations (channel iterations (R), decoding iterations (N), or a combination of R and N) can be monitored using a window W. For example, suppose that three is the maximum number of iterations (R, N, or (R+N)) that can be performed to decode each sample for a specified throughput rate.

The iterative decoder may decode each codeword (information unit) and may converge (i.e., find a valid codeword) in one, two, or three iterations. For example, when SNR is good, the iterative decoder may converge in one or two iterations when decoding a sample. When the SNR degrades, however, the iterative decoder may have to perform all three iterations for each sample. For example, in the window W from sample (t−W) to sample t, the maximum number of iterations may have to be performed to decode each sample. When the maximum number of iterations are performed for an extended period of time, the IC may overheat.

By monitoring and controlling the number of iterations in a window, the average power and heat generated can be controlled. For example, let X denote the total number of iterations performed to decode samples in the window W from sample (t−W) to sample t. The total number of iterations in the window from sample t to (t+W) (or from sample (t−W+1) to (t+1)) can be limited to Y, where Y is less than X, and where X and Y are positive integers. Y can be determined by limiting or reducing the maximum number of iterations per sample (e.g., to less than 3 in the above example). Alternatively, Y can be determined using a moving average method explained below.

Reducing the number of iterations reduces the amount of heat generated in the window, which in turn decreases the temperature of the IC. The number of iterations per window may be maintained at Y (or can be further reduced) for subsequent windows until the temperature of the IC decreases to a predetermined temperature or by a predetermined amount.

Alternatively, the moving average method explained below can be used to adjust Y for each consecutive window until the temperature of the IC decreases to a predetermined temperature or by a predetermined amount. The limit on the number of iterations can be removed after the temperature of the IC decreases to a predetermined temperature or by a predetermined amount.

Using this procedure, the average power consumed can be controlled in terms of the maximum number of iterations allowed per sample in each window. For example, suppose the maximum number of iterations allowed per sample in a window is P, where P is a positive integer (e.g., P=3 in the above example). Using the above procedure, the average power can be less than the power that will be consumed when an average of Q iterations are performed per window, where Q is a number less than P.

For example, since P=3 in the above example, Q can be a number less than 3 (e.g., 2.2) if the number of iterations are temporarily reduced to 2 or 1. Accordingly, the average power can be less than the power that will be consumed when an average of 2.2 iterations are performed per sample in each window.

A reduction in number of iterations or a switch to retry mode may be triggered in many ways. For example, the temperature of the IC can be measured using a temperature sensor. A control signal can be generated to trigger the reduction in number of iterations or the switch to retry mode when the temperature exceeds a predetermined temperature.

Alternatively, a moving average of number of iterations can be computed using a moving window, and a control signal can be generated when the moving average exceeds a predetermined threshold. The control signal may be called a channel iteration gate (CIG) flag. The moving average approach is explained below in detail.

Figure 3:
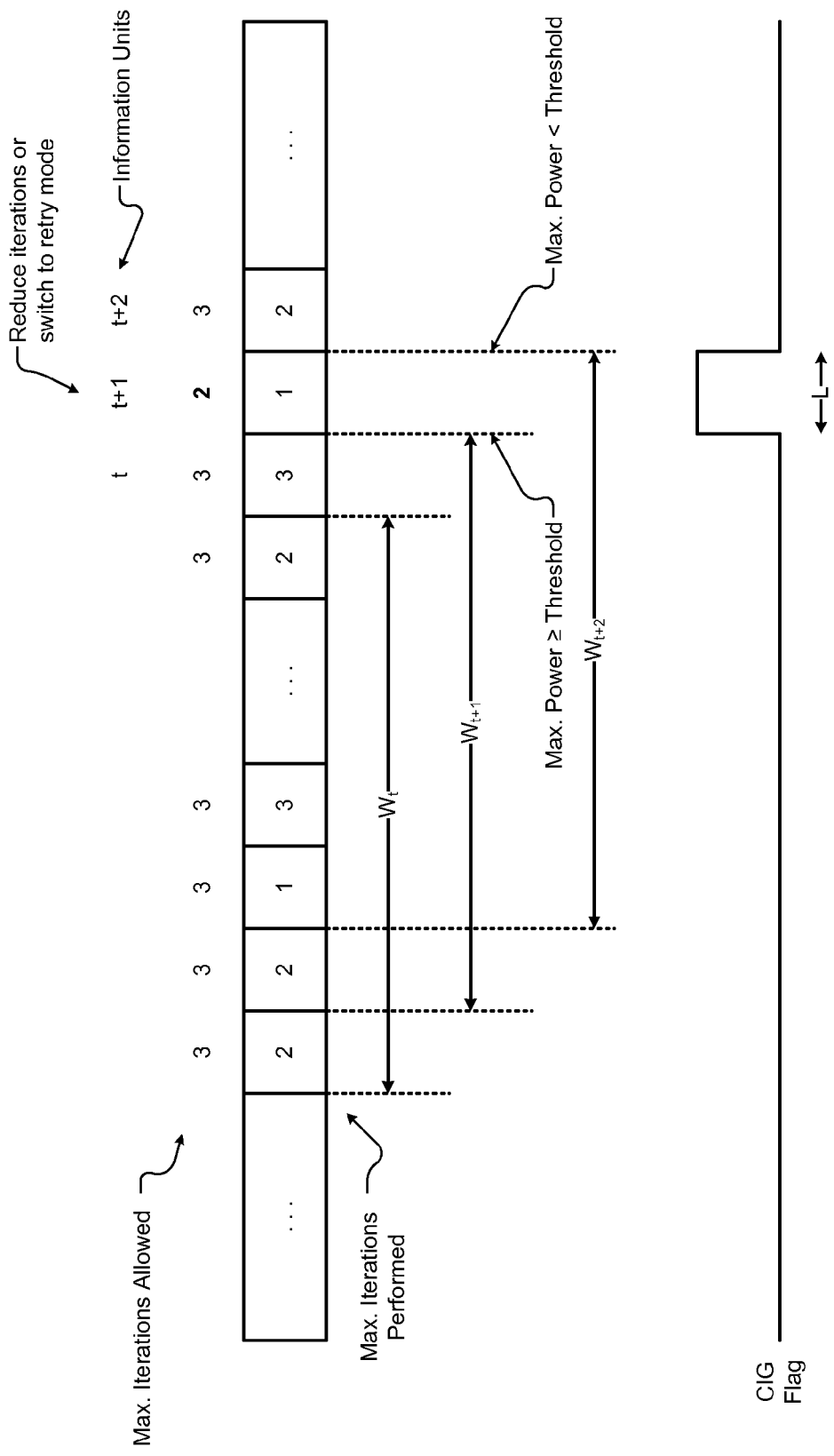
FIG. 3 depicts a moving window for generating a moving average of decoding iterations.

Referring now to FIG. 3, a moving window of size W is used in the moving average approach, where W is the number of information units decoded in the window. After the W information units are decoded, the window is moved each time an additional information unit is decoded.

When the window is moved, a first information unit in the window (i.e., the left-most information unit) moves out of the window. Further, an information unit subsequent to the last information unit (i.e., the right-most information unit) in the window is added to the window. Accordingly, the size W of the moving window remains unchanged.

For example only, suppose that the maximum number of iterations allowed to decode each information unit is initially 3. The total number of iterations performed to decode information units within the window $W_t$ may be 2, 2, 1, 3, . . . , and 2 as shown. After the window is moved, the next information unit may need 3 iterations to decode. Accordingly, the total number of iterations performed to decode information units within the window $W_{t+1}$ may be 2, 1, 3, . . . , 2, and 3 as shown. At this point, the power consumed may be maximum tolerable power, which may be defined as an amount of power consumed that increases the temperature of the IC to the threshold temperature. Accordingly, the CIG flag may be set as shown.

When the CIG flag is set, a retry mode may be selected or the maximum number of iterations may be reduced to decode the subsequent information unit. In the example shown, the maximum number of iterations to decode the information unit is reduced from 3 to 2 (shown highlighted).

After the window is moved, the next information unit may be decoded in less than the reduced number of iterations allowed (e.g., in one iteration). Accordingly, the total number of iterations performed to decode information units in the window $W_{t+2}$ may be 1, 3, . . . , 2, 3, and 1 as shown. At this point, the power consumed may be less than the maximum tolerable power. Accordingly, the CIG flag may be reset as shown.

In general, the CIG flag is set when a moving average of the total number of iterations performed over the window of size W is greater than or equal to a programmable threshold M. The programmable threshold M may be expressed as M=R*c*W. R is the maximum number of iterations allowed to decode each information unit for a specified throughput rate. W is the size of the moving window. c is a programmable percentage (e.g., 80%). In some implementations, the value of R may not be constant. Rather, the value of R may change from information unit to information unit.

A duration L for which the CIG flag remains set (or after which the CIG flag is reset) may be expressed in terms of the number of information units decoded after the CIG flag is set. In the example shown, L=1. That is, the CIG flag is reset after decoding one information unit since the information unit (t+2) needed less than the reduced maximum number of iterations (2). After resetting the CIG flag, the maximum number of iterations allowed is reset to the maximum value allowed during normal operation (e.g., 3).

Figure 4:
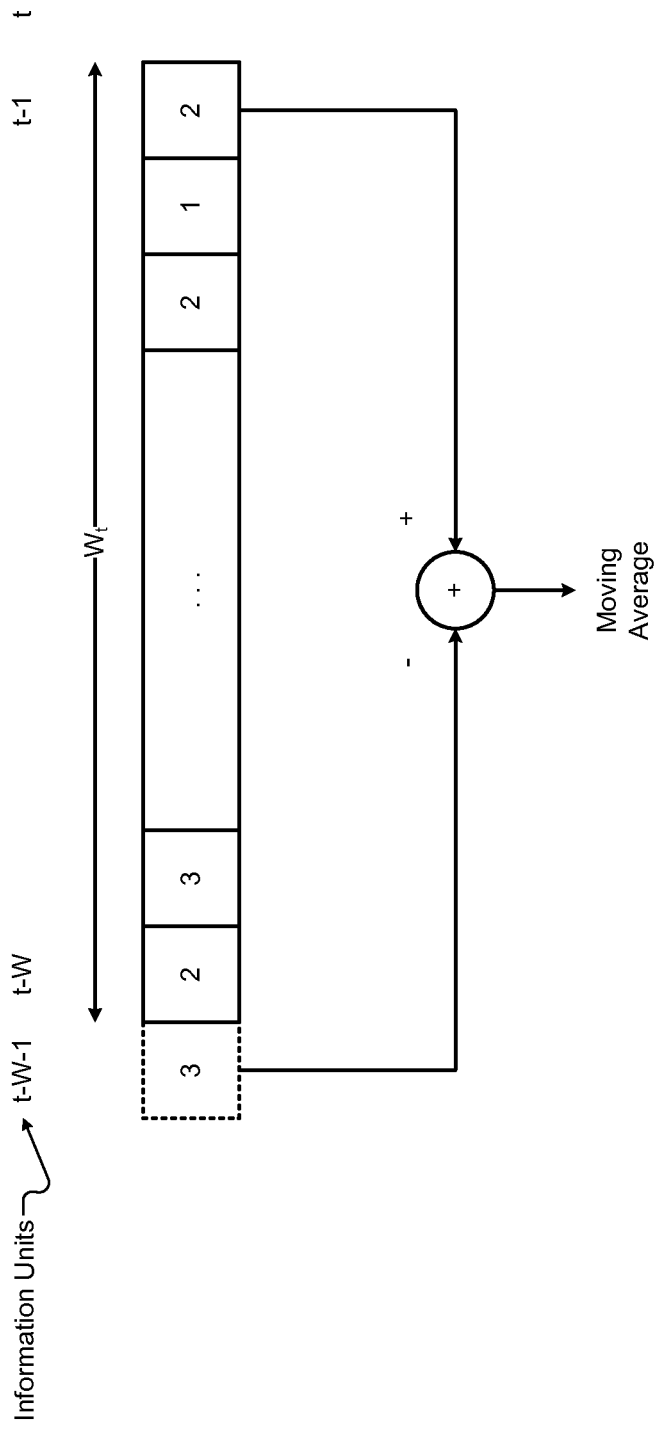
FIG. 4 depicts an example of generating a moving average.

Referring now to FIG. 4, the moving average of the number of iterations performed over the window of size W may be computed as follows. When the window is moved from information unit (t−1) to t, the total number of iterations performed in the window is counted. The number of iterations performed to decode an information unit (t−W−1) is subtracted from the total number of iterations performed in the window. The number of iterations performed to decode an information unit (t−1) is added to the result of the subtraction. The net result is the moving average. The CIG flag is set if the moving average is greater than or equal to the programmable threshold M.

A probability $P_{CIG\text{-}FLAG}(W,c)$ that the CIG flag will be set can be estimated for different values of (W,c) as follows. The values of W and c can be selected based on the probability $P_{CIG\text{-}FLAG}(W,c)$. For example only, suppose that the maximum number of iterations allowed for decoding each information unit is 3. Let $w_1$, $w_2$, and $w_3$ denote the number of information units in a window of size W that need 1, 2, and 3 iterations to decode, respectively. Then $W=(w_1+w_2+w_3)$, and $w_1+2w_2+3w_3=3cW=M$, where $(1/3)<c<1$.

The probability $P_{CIG\text{-}FLAG}(W,c)$ is computed as follows. If for a given (W,c), $$\exists (w_1, w_2, w_3) s.t. \sum_{i=1}^{3} w_i = W \text{ and } \sum_{i=1}^{3} i \cdot w_i \geq 3 \cdot c \cdot W$$

$$P_{CIG\_FLAG}(W, c) = \sum_{\substack{(w_1,w_2,w_3) \\ \sum w_i = W, \sum i w_i \geq M}} \left( \frac{W!}{w_1! w_2! w_3!} \cdot p_1^{w_1} p_2^{w_2} p_3^{w_3} \right) \sim$$

$$\max_{\substack{(w_1,w_2,w_3) \\ \sum w_i = W, \sum i w_i \geq M}} \left( \frac{W!}{w_1! w_2! w_3!} \cdot p_1^{w_1} p_2^{w_2} p_3^{w_3} \right)$$

That is, if for a given (W,c), there exists $w_1$, $w_2$, and $w_3$ such that the two summations shown above are satisfied, then the CIG flag will be set, and the probability that the CIG flag will be set is $P_{CIG\text{-}FLAG}(W,c)$, which is given by the above equation.

In the above equation, probabilities $p_1$, $p_2$, and $p_3$ denote probabilities that 1, 2, and 3 iterations will be needed to decode an information unit, respectively. In storage devices, for example, the probabilities can be expressed in terms of a sector failure rate (SFR) as follows: $p_1=(1-SFR_1)$, $p_2=(SFR_1-SFR_2)$, and $p_3=(SFR_2)$. Thus, $p_1$ is a probability that decoding of an information unit will succeed in one iteration. $p_2$ is a probability that decoding of an information unit will not succeed in one iteration but will succeed in two iterations. $p_3$ is a probability that decoding of an information unit will not succeed in two iterations but will succeed in three iterations.

Using the above equation, values of W and c can be selected such that the probability $P_{CIG\text{-}FLAG}(W,c)$ is low. For example, for each c, a smallest value of W is selected such that $P_{CIG\text{-}FLAG}(W,c)$ is less than a threshold value.

Figure 5:
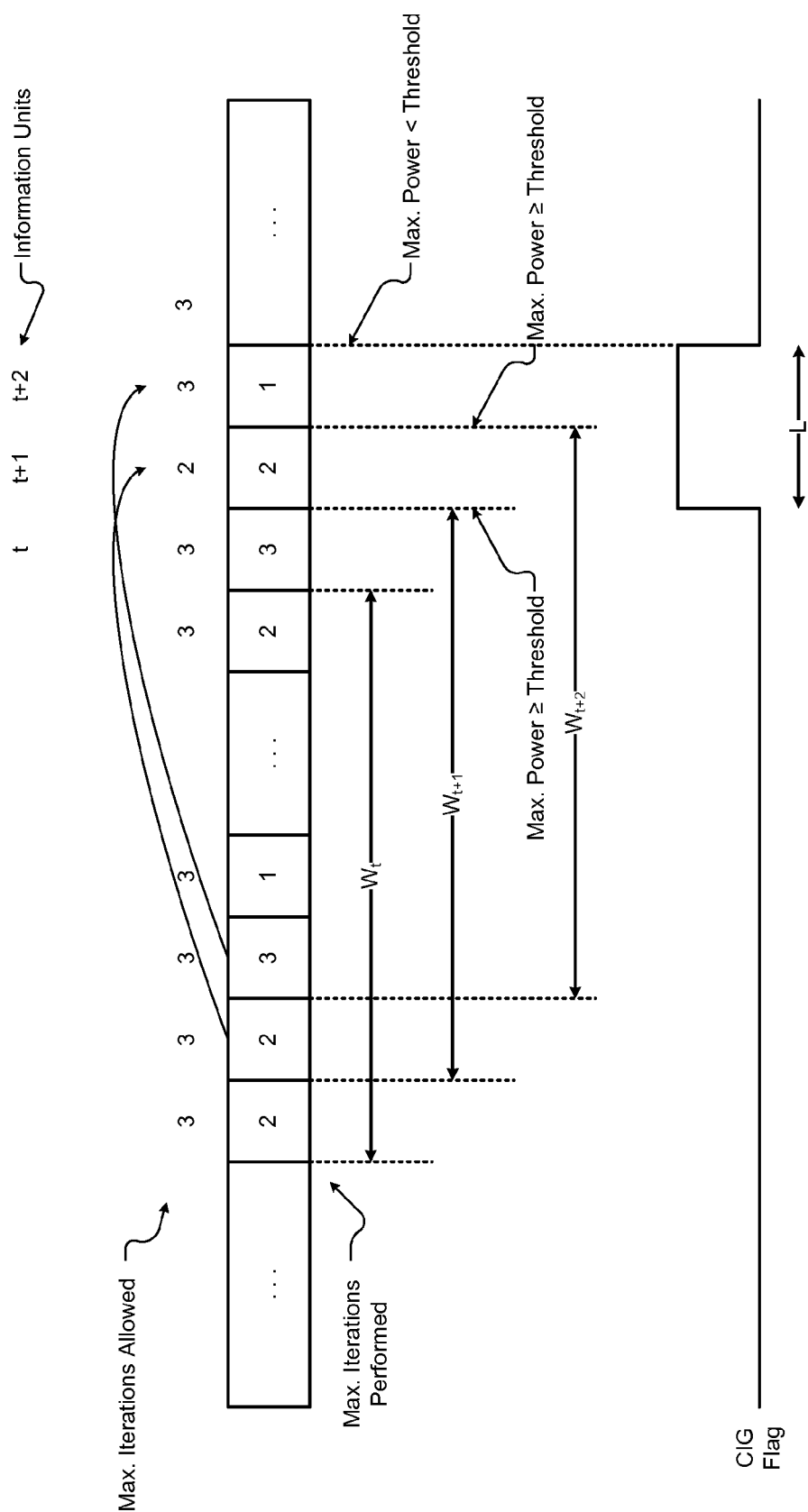
FIG. 5 depicts an example of using moving average to limit the number of decoding iterations.

Referring now to FIG. 5, when the CIG flag is set, the maximum number of iterations can be adjusted in many ways. One way is shown in FIG. 5 using the example, where the maximum number of iterations allowed to decode each information unit is 3. For example, the CIG flag is set after decoding an information unit t since power consumed at this point is maximum tolerable power. When the window $W_{t+1}$ is moved to $W_{t+2}$, the maximum number of iterations for decoding the information unit (t+1) is adjusted. The maximum number of iterations for decoding the information unit (t+1) is set equal to (i.e., copied from) the maximum number of iterations used to decode an information unit moving out of the window $W_{t+1}$ when the window $W_{t+1}$ is moved to $W_{t+2}$.

As shown, the CIG flag remains set after decoding the information unit (t+1) since the power consumed at this point is still maximum tolerable power. When the window $W_{t+2}$ is moved further, the maximum number of iterations for decoding the information unit (t+2) is adjusted. The maximum number of iterations for decoding the information unit (t+2) is set equal to (i.e., copied from) the maximum number of iterations used to decode an information unit moving out of the window $W_{t+2}$ when the window $W_{t+2}$ is moved further.

In some implementations, instead of using the adjustment procedure described above, the maximum number of iterations can be fixed to a predetermined value when the window is moved. The predetermined value is less than the maximum number of iterations allowed. For example, the maximum number of iterations can be fixed to 2 or 1, which is less than 3 in the example shown.

As shown, the information unit (t+2) is decoded using only one iteration. Accordingly, the power consumed at this point is less than the maximum tolerable power, and the CIG flag is reset after decoding the information unit (t+2), and so on.

Figure 6:
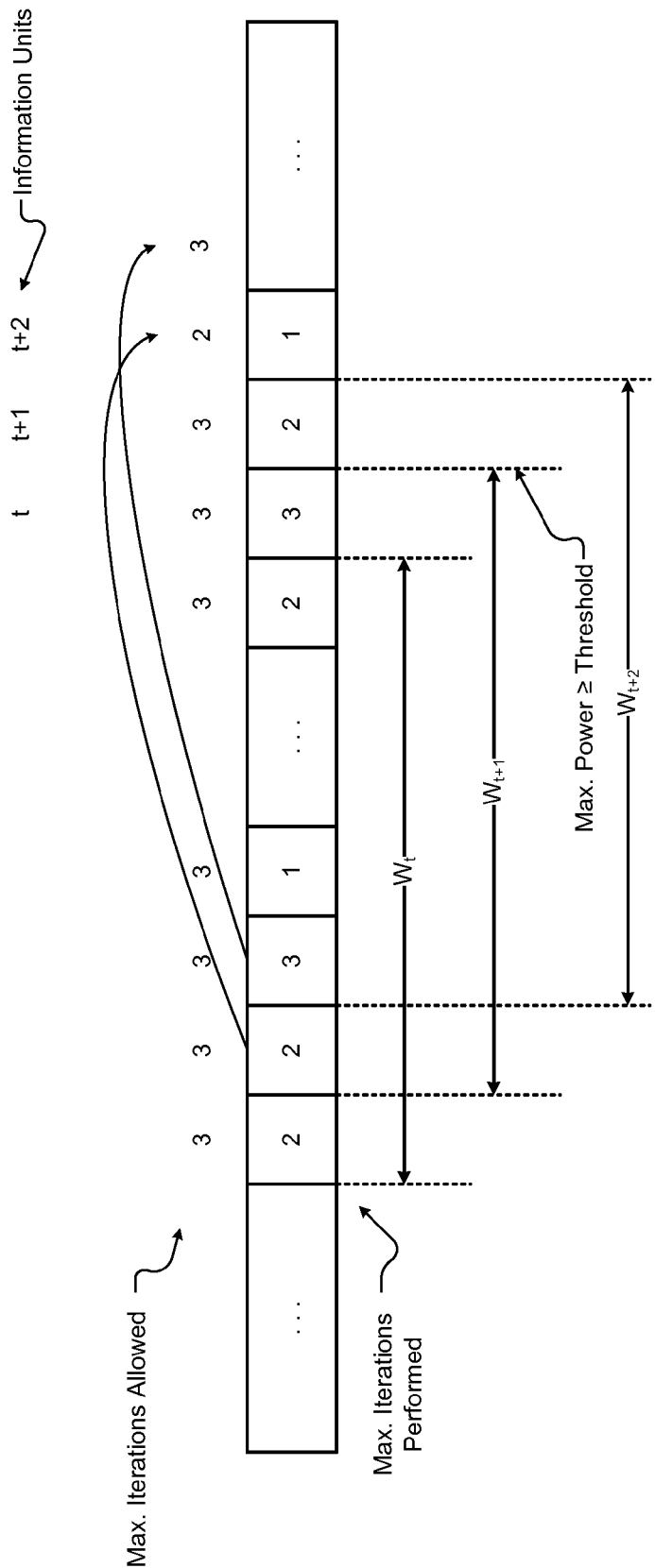
FIG. 6 depicts an example of using moving average to limit the number of decoding iterations when samples are processed in parallel.

Referring now to FIG. 6, the maximum number of iterations is adjusted differently when E information units are decoded in parallel, where E is an integer greater than 1. For example, suppose E=2 as shown. The CIG flag is set after decoding information unit t. When the window $W_{t+1}$ is moved to $W_{t+2}$, the maximum number of iterations for decoding the information unit (t+2) (instead of (t+1)) is adjusted. This allows decoding of information units t and (t+1) to complete using the current value of maximum number of iterations. The maximum number of iterations for decoding the information unit (t+2) is set equal to (i.e., copied from) the maximum number of iterations used to decode an information unit moving out of the window $W_{t+1}$ when the window $W_{t+1}$ is moved to $W_{t+2}$, and so on. The above example can be generalized to any value of E>1, where (t+2) can be replaced by (t+E) in the above example.

Figure 7:
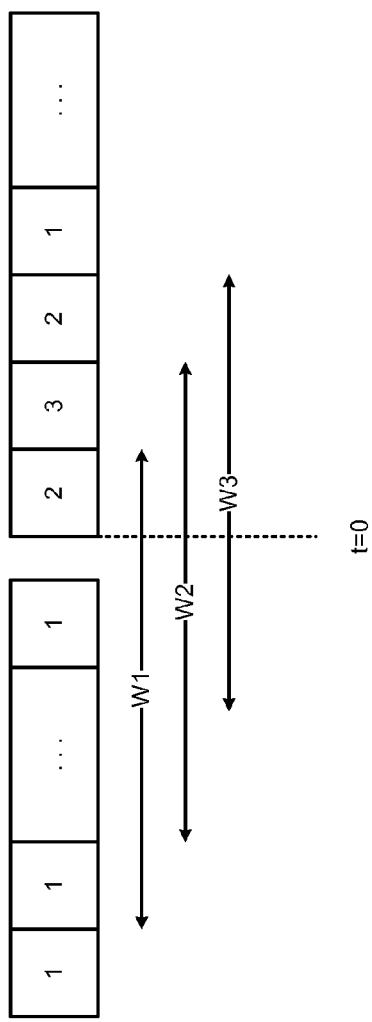
FIG. 7 depicts an example of initializing a moving window.

Referring now to FIG. 7, at power-on/reset, the window is initialized as follows. The maximum number of iterations for decoding each information unit in the window is initially set to 1. Thereafter, the maximum number of iterations is adjusted between 1 and R as described above.

Figure 8:
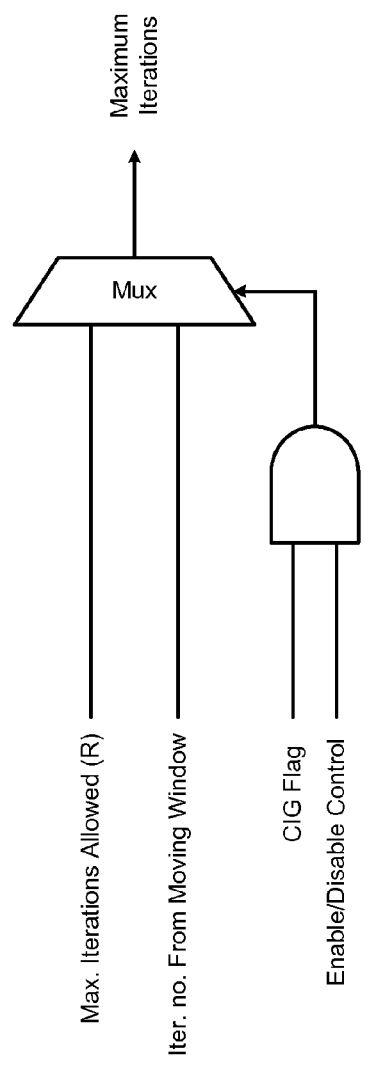
FIG. 8 shows an example of a circuit to enable/disable control of the maximum number of iterations.

Referring now to FIG. 8, in some implementations, adjusting the maximum number of iterations may be optional. For example, a control signal representing the CIG flag may be gated using an AND gate. An Enable/Disable signal is input to the AND gate. The Enable/Disable signal determines whether the CIG flag is used to limit iterations.

The output of the AND gate, which depends on the Enable/Disable signal, controls a multiplexer (MUX). Depending on the control, the MUX outputs the maximum number of iterations allowed (R) or the number of iterations limited using the moving average method.

The MUX outputs R when the Enable/Disable signal indicates that the CIG flag is not used to limit iterations. Otherwise, the MUX outputs the maximum number of iterations used to decode an information unit moving out of the window. Accordingly, the CIG flag can be ignored, and R iterations can be used; or when the CIG flag is used, the number of iterations used to decode an information unit moving out of the window is used.

Figure 9:
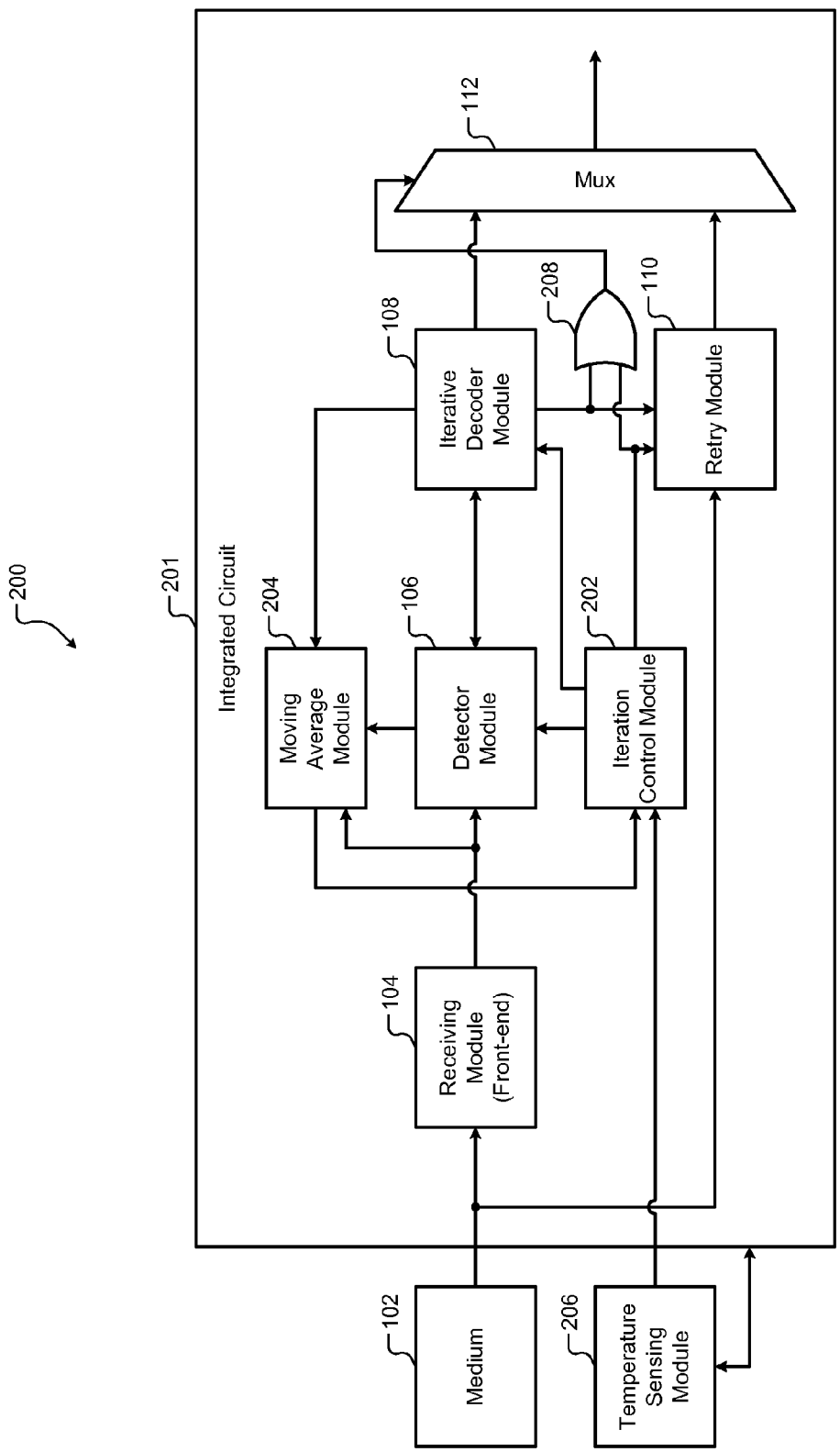
FIG. 9 is a functional block diagram of a system for controlling power consumed by an integrated circuit (IC) and for preventing the IC from overheating.

Referring now to FIG. 9, a system 200 for reducing average and peak power consumed by an IC and for preventing the IC from overheating is shown. The system 200 comprises an IC 201, the medium 102, and a temperature sensing module (optional) 206. The IC 201 comprises the receiving module 104, the detector module 106, the iterative decoder module 108, the retry module 110, and the multiplexer 112. Additionally, the IC 201 comprises an iteration control module 202, a moving average module 204, and an OR gate 208.

The temperature sensing module 206 senses the temperature of the IC 201. The moving average module 204 generates the moving average as described with reference to FIGS. 2-8. Based on the temperature or the moving average, the iteration control module 202 controls the average and peak power consumed by the IC 201 and prevents the IC 201 from overheating as described with reference to FIGS. 2-8. Specifically, the iteration control module 202 activates the retry mode or limits the maximum number of iterations performed by the detector module 106 and/or the iterative decoder module 108 as described with reference to FIGS. 2-8.

To force the retry mode, the iteration control module 202 generates a control signal (e.g., when the CIG flag is set). The control signal activates the retry module 210 and deactivates the detector module 106 and/or the iterative decoder module 108. The control signal is OR'ed with the signal generated by the iterative decoder module 108 that indicates a decoding failure. The output of the OR gate controls the multiplexer 112.

The iteration control module 202 deactivates the retry mode and reactivates the detector module 106 and/or the iterative decoder module 108 when the temperature of the IC 201 decreases (e.g., when the moving average is less than M). Instead, if the iterations are limited, the iteration control module 202 resets the number of iterations to the maximum number allowed (R) for the specified throughput when the temperature of the IC 201 decreases (e.g., when the moving average is less than M). In summary, the iteration control module 202 and the moving average module 204 perform the functions and operations described with reference to FIGS. 2-8 and prevent the IC 201 from overheating.

Referring now to FIG. 10, a method 300 for reducing average and peak power consumed by an IC and for preventing the IC from overheating is shown. Control begins at 302. At 304, control determines if the IC temperature is greater than or equal to a threshold temperature. Alternatively, control may determine that the maximum tolerable power is reached if the moving average of iterations in a window W is greater than or equal to the threshold M. If the IC temperature is greater than or equal to the predetermined value (or if the maximum tolerable power is reached), control determines at 306 whether the number of iterations is to be limited. If the number of iterations is to be limited, control limits the number of iterations at 308. Instead, if the retry mode is to be forced, control activates the retry mode at 310.

At 312, control determines if a decoding failure occurred after limiting the number of iterations. If a decoding failure occurred, control activates the retry mode at 310. If no decoding failure occurred and after decoding current information unit using the retry mode, control determines at 314 if the IC temperature is less than a predetermined temperature. In some implementations, control may not determine if the IC temperature is less than the predetermined temperature after each information unit is processed. Rather, control may determine if the IC temperature is less than the predetermined temperature after every F information units are processed, where F is an integer greater than or equal to 1 (e.g., F=10). Control returns to 306 if the IC temperature is not less than the predetermined temperature. Control returns to 304 if the IC temperature is less than a predetermined temperature.

Figure 12:
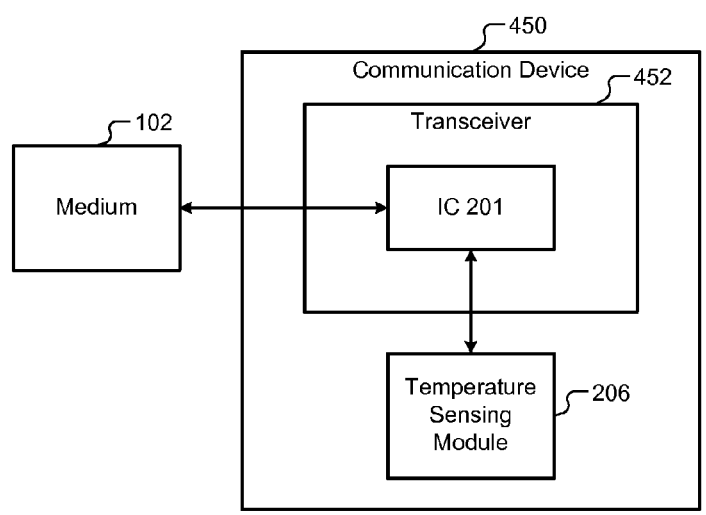
FIG. 12 is a functional block diagram of a communication device that uses the system/method shown in FIGS. 9-10.

Referring now to FIGS. 11 and 12, examples of devices in which the system 200/method 300 can be used are shown. In FIG. 11, a disk drive (a hard disk drive (HDD) or a solid-state disk (SSD)) 400 comprises the medium 102 and a disk controller 402. The medium 102 includes a magnetic medium when the disk drive 400 is a HDD. The medium 102 includes a memory array when the disk drive 400 is a SSD. The disk controller 402 comprises a read channel module 404 that includes the IC 201. The disk controller 402 may also include the temperature sensing module 206. The IC 201 decodes the data read from the medium 102 as described above.

In FIG. 12, a communication device 450 comprises a transceiver 452 that communicates with the medium 102. The medium 102 can be a wireline or a wireless medium. The transceiver 452 comprises the IC 201. The communication device 450 may also include the temperature sensing module 206. The IC 201 decodes the data read from the medium 102 as described above.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An integrated circuit comprising:
a decoding module configured to decode a plurality of information units by performing a number of decoding iterations on each of the plurality of information units;
a moving average module configured to generate a moving average of decoding iterations performed when decoding a selected number of information units of the plurality of information units; and
an iteration control module configured to adjust the number of decoding iterations based on (i) the moving average of decoding iterations performed in decoding the selected number of information units of the plurality of information units and (ii) an amount of power consumed by the integrated circuit.

2. The integrated circuit of claim 1, wherein the iteration control module is configured to adjust the number of decoding iterations in response to the moving average being greater than or equal to a predetermined threshold.

3. The integrated circuit of claim 1, wherein the iteration control module is configured to adjust the number of decoding iterations in response to the amount of power consumed by the integrated circuit being greater than or equal to a predetermined level.

4. The integrated circuit of claim 1, wherein the adjusted number of decoding iterations is less than or equal to a predetermined number.

5. The integrated circuit of claim 1, wherein the decoding module is configured to decode an information unit subsequent to the selected number of information units by performing a number of decoding iterations less than or equal to the adjusted number of decoding iterations.

6. The integrated circuit of claim 1, wherein the iteration control module is configured to adjust the number of decoding iterations used to decode each information unit subsequent to the selected number of information units until the amount of power consumed by the integrated circuit decreases by a predetermined amount.

7. The integrated circuit of claim 1, wherein the adjusted number of decoding iterations used to decode an information unit subsequent to the selected number of information units is equal to a number of decoding iterations performed to decode a first information unit of the selected number of information units.

8. The integrated circuit of claim 1, wherein:
the iterative control module is configured to decode the plurality of information units in parallel,
the iteration control module is configured to adjust the number of decoding iterations used to decode a last one of the plurality of information units following a last information unit of the selected number of information units, and
the adjusted number of decoding iterations is equal to a number of decoding iterations performed to decode a first information unit of the selected number of information units.

9. An integrated circuit comprising:
a decoding module configured to decode a plurality of information units by performing a number of decoding iterations on each of the plurality of information units;
a moving average module configured to generate a moving average of decoding iterations performed when decoding a selected number of information units of the plurality of information units; and
an iteration control module configured to adjust the number of decoding iterations in response to (i) the moving average being greater than or equal to a predetermined threshold and (ii) an amount of power consumed by the integrated circuit being greater than or equal to a predetermined level.

10. The integrated circuit of claim 9, wherein the adjusted number of decoding iterations is less than or equal to a predetermined number.

11. The integrated circuit of claim 9, wherein the decoding module is configured to decode an information unit subsequent to the selected number of information units by performing a number of decoding iterations less than or equal to the adjusted number of decoding iterations.

12. The integrated circuit of claim 9, wherein the iteration control module is configured to adjust the number of decoding iterations used to decode each information unit subsequent to the selected number of information units until the amount of power consumed by the integrated circuit decreases by a predetermined amount.

13. The integrated circuit of claim 9, wherein the adjusted number of decoding iterations used to decode an information unit subsequent to the selected number of information units is equal to a number of decoding iterations performed to decode a first information unit of the selected number of information units.

14. The integrated circuit of claim 9, wherein:
the iterative control module is configured to decode the plurality of information units in parallel,
the iteration control module is configured to adjust the number of decoding iterations used to decode a last one of the plurality of information units following a last information unit of the selected number of information units, and
the adjusted number of decoding iterations is equal to a number of decoding iterations performed to decode a first information unit of the selected number of information units.

15. A method for controlling an amount of power consumed by an integrated circuit, the method comprising:
decoding a plurality of information units by performing a number of decoding iterations on each of the plurality of information units;

generating a moving average of decoding iterations performed in decoding a selected number of information units of the plurality of information units; and adjusting the number of decoding iterations in response to (i) the moving average being greater than or equal to a predetermined threshold and (ii) the amount of power consumed by the integrated circuit being greater than or equal to a predetermined level.

16. The method of claim 15, wherein the adjusted the number of decoding iterations is less than or equal to a predetermined number.

17. The method of claim 15, further comprising decoding an information unit subsequent to the selected number of information units by performing decoding iterations less than or equal to the adjusted number of decoding iterations.

18. The method of claim 15, further comprising adjusting the number of decoding iterations used to decode each information unit subsequent to the selected number of information units until the amount of power consumed by the integrated circuit decreases by a predetermined amount.

19. The method of claim 15, wherein the adjusted number of decoding iterations used to decode an information unit subsequent to the selected number of information units is equal to a number of decoding iterations performed to decode a first information unit of the selected number of information units.

20. The method of claim 15, further comprising:

decoding the plurality of information units in parallel; and adjusting the number of decoding iterations used to decode a last one of the plurality of information units following a last information unit of the selected number of information units, wherein the adjusted number of decoding iterations is equal to a number of decoding iterations performed to decode a first information unit of the selected number of information units.

\* \* \* \* \*